United States Patent

[11] 3,586,931

[72] Inventor Rijkent Jan Nienhuis
Nijmegen, Netherlands
[21] Appl. No. 865,581
[22] Filed Oct. 13, 1969
[45] Patented June 22, 1971
[73] Assignee U. S. Philips Corporation
New York, N.Y.

[54] JUNCTION FIELD EFFECT POWER TRANSISTOR WITH INTERNALLY INTERCONNECTED GATE ELECTRODES
7 Claims, 12 Drawing Figs.

[52] U.S. Cl. .......... 317/235, 317/234
[51] Int. Cl. .......... H01l 1/14
[50] Field of Search .......... 317/235, 235 AC

[56] References Cited

UNITED STATES PATENTS

| | | | |
|---|---|---|---|
| 2,930,950 | 3/1960 | Tesgner | 317/235 |
| 3,025,438 | 3/1962 | Wegener | 317/235 |
| 3,165,430 | 1/1965 | Hugle | 148/187 |
| 3,183,128 | 5/1965 | Leistiko | 148/186 |
| 3,346,786 | 10/1967 | Parmer | 317/235 |
| 3,484,865 | 12/1969 | Nienhuis | 317/265 |

*Primary Examiner*—James D. Kallam
*Attorney*—Frank R. Trifari

ABSTRACT: A junction field effect transistor adapted for power applications is described. It comprises interdigital source and drain contacts and a surface gate electrode connected at its ends to a substrate gate. To reduce the gate resistance, plural zones are provided which extend through the channel interconnecting the surface gate with the substrate gate regions. The interconnecting zones may be in the form of columns or strips.

Figure 1:
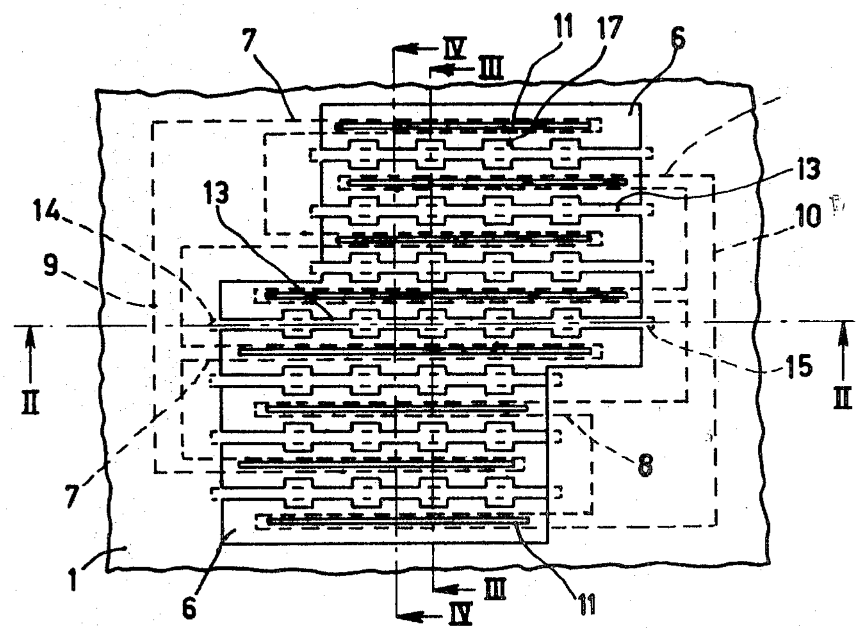

INVENTOR.

RIJKENT J. NIENHUIS

BY

AGENT

INVENTOR.

RUKENT J. NIENHUIS

BY

AGENT

INVENTOR.
RIJKENT J. NIENHUIS
BY
AGENT

INVENTOR.

RIJKENT J. NIENHUIS

BY

AGENT

JUNCTION FIELD EFFECT POWER TRANSISTOR WITH INTERNALLY INTERCONNECTED GATE ELECTRODES

The invention relates to a semiconductor device having a semiconductor body covered on one surface at least partly with an insulating layer and comprising at least one field effect transistor. The body contains a substrate region of one conductivity type adjoining said one surface and belonging to the gate electrode and provided with a connection conductor, and a first surface zone of the opposite conductivity type within said substrate region. At least two substantially parallel strip-shaped conductors are situated on said one surface which conductors belong to the source and drain electrodes and are connected at least locally to the said first surface zone. A strip-shaped second surface zone of said one conductivity type is situated between said conductors substantially parallel to said conductors and belongs to the gate electrode. The ends of said second surface zone extend to beyond the first surface zone and adjoin there the substrate region. The part of the first surface zone which is situated between the second surface zone and the substrate region forms a channel region of the field effect transistor.

Semiconductor devices having a field effect transistor of the type above described are known and may advantageously be used in planar monolithic integrated circuits. In this case the source and drain electrodes are provided on one surface of the semiconductor body (which usually is in the form of a plate), while the gate electrode can be connected by means of a connection conductor provided either on the said one surface or elsewhere on the substrate region. By biasing the PN junction between the gate electrode and the said one surface zone of the opposite conductivity type in the reverse direction, the channel region can be closed entirely or partly for charge transport.

The transistor structures in question are used particularly for high-power transistors. It is endeavored to make the overall section of the channel region as large as possible, by giving the strip-shaped gate electrode region or regions a relatively large length. The result of this is, however, that the series resistance between the gate electrode connection conductor provided on the substrate region and those regions of a strip-shaped gate electrode zone which are situated at a comparatively large distance from the connection between the strip-shaped zone and the substrate region, becomes undesirable large and, in cooperation with the gate electrode capacity, adversely influences the switching speed of such field effect transistors. Furthermore, in the case of high values of the said series resistance, unequal influencing of the channel region may occur by voltage losses occurring as a result of leakage currents over the strip-shaped gate electrode zone.

It is the object of the invention inter alia to provide an improved structure of a device having a field effect transistor of the type described, in which the said drawbacks are avoided or at least considerably reduced.

The invention is based inter alia on the recognition of the fact that, by connecting the strip-shaped gate electrode zone or zones, besides via their ends, also in other places to the substrate region via connecting zones in the semiconductor body, a more uniform use of the said gate electrode zones can be made and notably a higher switching speed can be achieved. Said measures can be arranged so that no additional manufacturing steps are necessary.

A semiconductor device having a field effect transistor of the type mentioned in the preamble is therefore characterized according to the invention in that the second surface zone, the strip-shaped gate electrode zone, is also connected, between its ends, to the substrate region via at least one interconnection zone of said one conductivity type.

Owing to the larger number of connection places between a strip-shaped gate electrode zone and the substrate region in the device according to the invention, the series resistance between gate electrode strips and gate connection conductor is strongly reduced, as a result of which a higher switching speed is obtained. As compared with the said known structures, the field effect transistor according to the invention also shows a higher gain, inter alia as a result of a more uniform influencing of the various channel regions by the strip-shaped gate electrode zones. The connecting zones can be provided in various manners, for example, in the form of surface zones of said one conductivity type which are embedded in the first surface zone of the opposite conductivity type and adjoin the substrate region beyond said first surface zone. However, a connection between the gate electrode strip and the substrate region is advantageously provided by connecting zones in a direction at substantially right angles to the said one surface. As a result of this it is achieved that oppositely located gate electrode regions (substrate region and gate electrode strip) are always substantially at equal potentials.

The interconnecting zones may have the form of columns or cylinders. Therefore, according to the invention, an important preferred embodiment is characterized in that one or more of the connecting zones are fully surrounded by the first surface zone of the opposite conductivity type. According to a further very important preferred embodiment one or more of the connecting zones consist of strip-shaped zones adjoining said one surface, the longitudinal dimension of which extends at substantially right angles to that of the strip-shaped gate electrode zones, said strip-shaped zones dividing the first surface zone of the opposite conductivity type into partial zones, the source and drain electrodes contacting all the partial zones.

Although the invention can advantageously be used in all field effect transistors of the type described, the invention is of particular advantage, as already noted, in high-power field effect transistors in which the source and drain electrode consists of two electrodes which form an interdigital system.

When the first surface zone of the opposite conductivity type is a zone diffused in a substrate of said one conductivity type, the connecting zone is advantageously formed by a portion of said substrate which extends through a recess in the first surface region up to the strip-shaped gate electrode zone. The advantage of this is that for the manufacture of the connecting zone no additional manufacturing step is necessary, since the connecting zone or zones can already be formed upon providing the first surface zone of the opposite conductivity type by providing said surface zone with the necessary recesses by means of normally used photolithographic masking techniques.

Since the depletion regions in the first surface zone of the opposite conductivity type, which determine the cross section of the channel, must have a reasonable thickness at none too high gate electrode voltages so as to obtain a satisfactory operation of the device, the said surface zone will not be doped very strongly. In order to obtain a good contacting of said comparatively high-ohmic material, according to a preferred embodiment the conductors belonging to the source and drain electrodes therefore comprise a highly doped surface zone of the opposite conductivity type at least at the contact places with the first surface zone.

Figure 2:
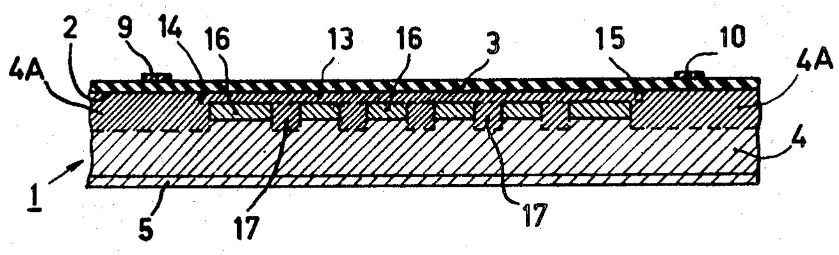
Figure 3:
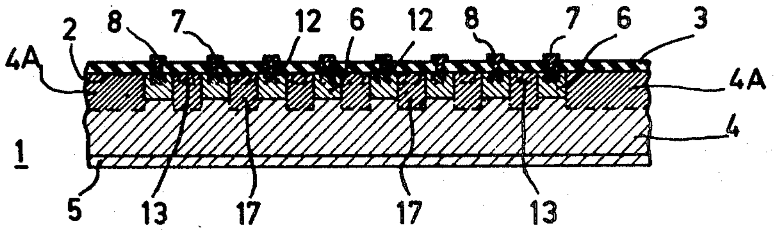
Figure 4:
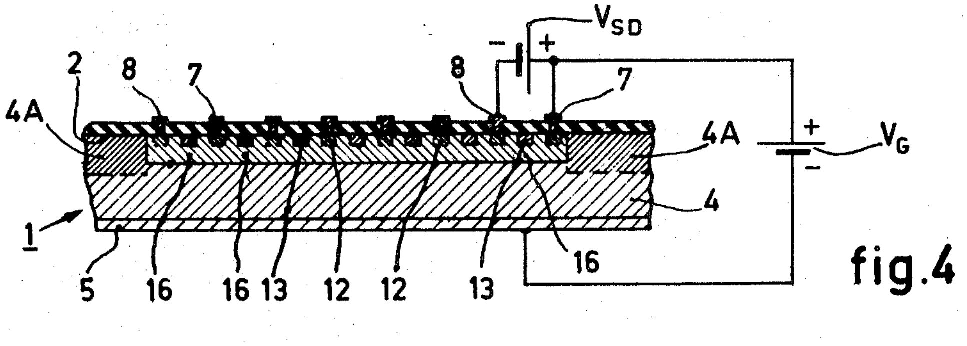
Figure 5:
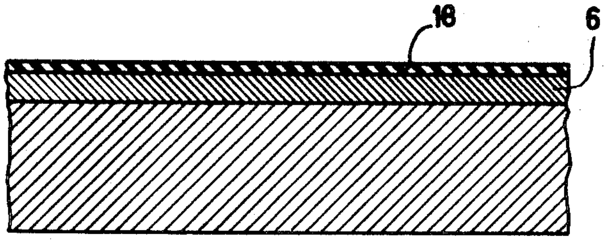
Figure 6:
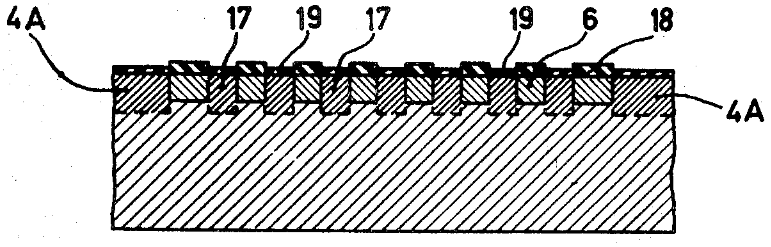
Figure 7:
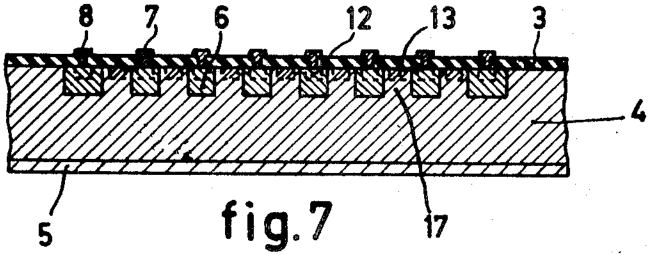
Figure 8:
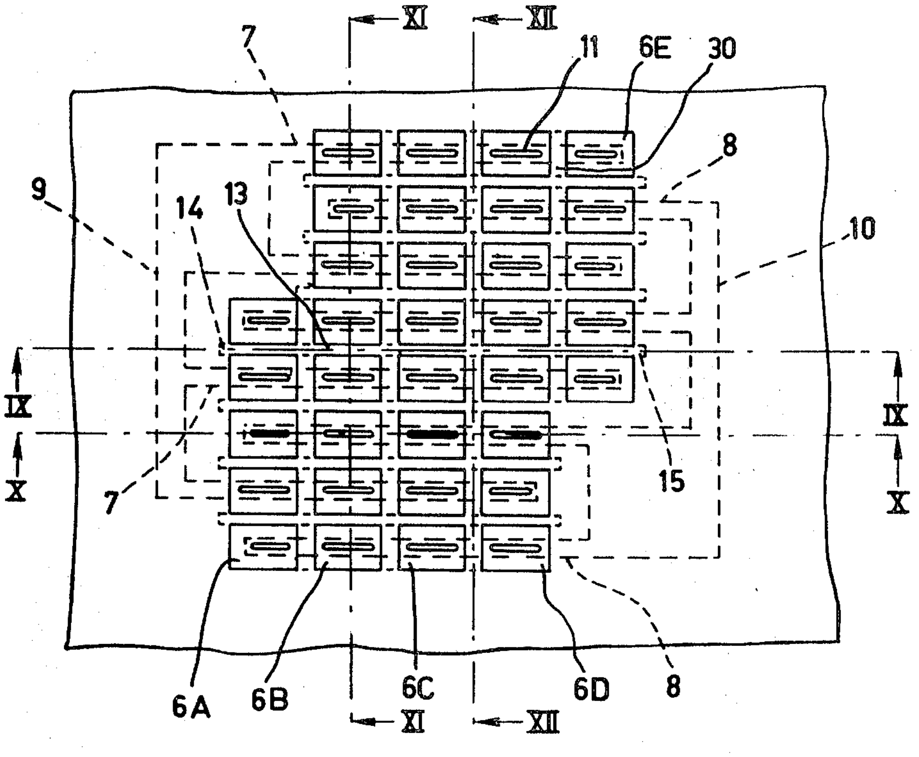
Figure 9:
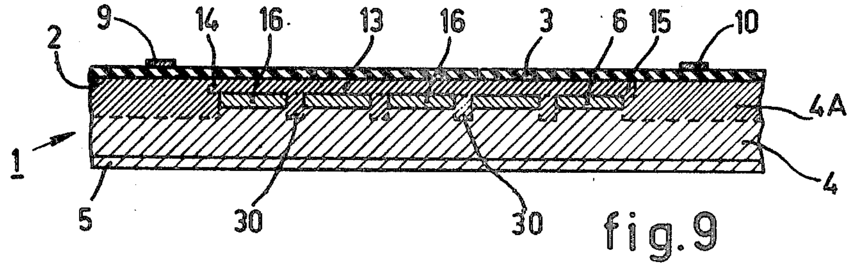
Figure 10:
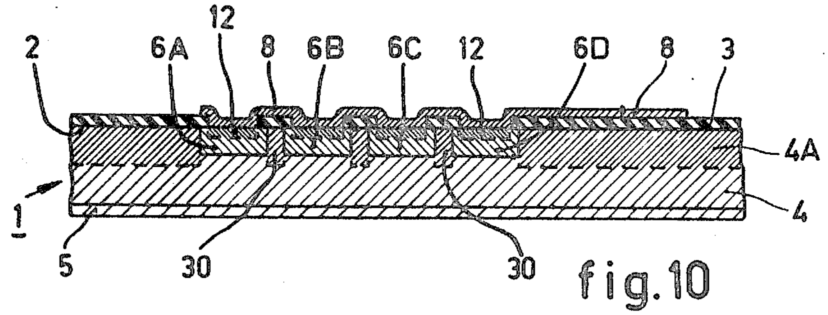
Figure 11:
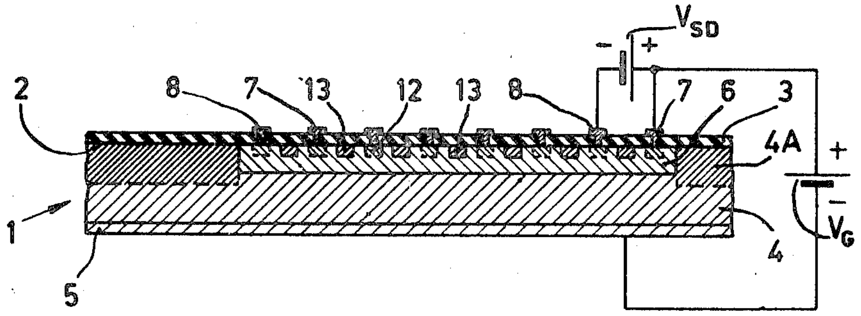
Figure 12:
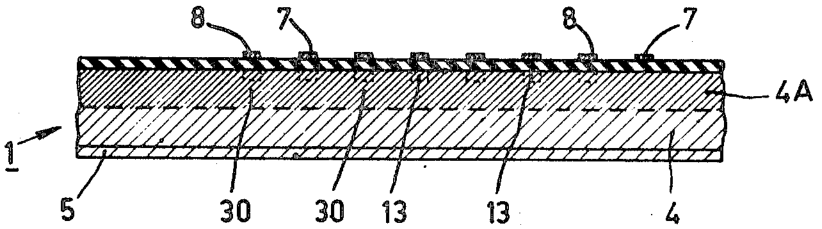

In order that the invention may be readily carried into effect, a few examples will now be described in greater detail with reference to the accompanying drawings, in which:

FIG. 1 is a diagrammatic plan view of a device according to the invention,

FIG. 2 is a diagrammatic cross-sectional view taken on the line II–II of FIG. 1, FIG. 3 is a diagrammatic cross-sectional view taken on the line III–III of FIG. 1, FIG. 4 is a diagrammatic cross-sectional view taken on the line IV–IV of FIG. 1, FIGS. 5 and 6 are diagrammatic cross-sectional views of the device shown in FIGS. 1 to 4, in various stages of manufacture, FIG. 7 is a diagrammatic cross-sectional view analogous to FIG. 3 of the device shown in FIGS. 1 to 4, but manufactured according to a different method, FIG. 8 is a diagrammatic plan view of another device according to the invention, FIG. 9 is a diagrammatic cross-sectional view taken on the line IX–IX of FIG. 8, FIG. 10 is a diagrammatic cross-sectional view taken on the line X–X of FIG. 8, FIG. 11 is a diagrammatic cross-sectional view taken on the line XI–XI of FIG. 8, FIG. 12 is a diagrammatic cross-sectional view taken on the line XII–XII of FIG. 8.

The Figures are diagrammatic and not drawn to scale in which, for clarity, notably the dimensions in the direction of their thickness are exaggerated. Corresponding components in the various Figures are referred to by the same reference numerals. The circumferences of meral layers provided on the surface are shown in broken lines in the plan views.

FIG. 1 is a plan view and FIGS. 2 to 4 are cross-sectional views of a device according to the invention. The device comprises a semiconductor body consisting of a silicon plate 1 having a thickness of 120 $\mu$m. which is covered at a surface 2 with a layer 3 of silicon oxide of 0.5 $\mu$m. thickness (see FIGS. 2 to 4).

A field effect transistor is provided in said silicon plate, which transistor, if desired together with one or more other semiconductor elements provided in the silicon plate, may form a monolithic integrated circuit. The drawing shows only that part of the silicon plate in which the field effect transistor is provided.

The field effect transistor comprises a P-type substrate region 4, 4A (see FIG. 2), adjoining the surface 2 which belongs to the gate electrode and comprises a connection conductor in the form of a metal layer 5 which makes a low-ohmic contact with the substrate region. The substrate region consists of a homogeneously doped P-type region 4 having a resistivity of 0.1 ohm cm. and a diffused, higher-doped P-type layer 4A which adjoins the surface 2.

Within the substrate region 4, 4A a first N-type surface zone 6 (see FIGS. 1, 3, 4), 5 $\mu$m. thickness, 1.5 ohm cm. resistivity, is provided. Furthermore, a number of aluminum strips 7 which mutually extend substantially in parallel and belong to the source electrode, and a number of aluminum strips 8 which belong to the drain electrode are provided on the surface 2 and are connected together by the aluminum strips 9 and 10 to form two interdigital electrodes 7, 9 and 8, 10. The source and drain electrodes (see FIG. 1) are connected to the zone 6 via windows 11 in the oxide layer 3. In order to obtain a low-ohmic contact between the aluminum strips and the zone 6 (see FIGS. 3, 4), the high-doped diffused N-type zones 12 are provided.

Between each pair of aluminum strips 7 and 8 a P-type conductive strip-shaped diffused second surface zone 13, 3 $\mu$m. width, depth of penetration 3 $\mu$m., is provided which extends substantially parallel to said aluminum strips and, like the substrate region, belongs to the gate electrode, the ends 14 and 15 of which surface zone (see FIGS. 1 and 2) extend to beyond the zone 6 and there join the part 4A of the substrate region. The parts 16 of the zone 6 (see FIGS. 2, 4) situated between the gate electrode strips 13 and the part 4 of the substrate region form channel regions of the field effect transistor.

According to the invention (see FIGS. 1, 2 and 3), each strip-shaped gate electrode zone 13 is connected, besides its ends 14 and 15, also between said ends to the substrate region 4, 4A via diffused P-type interconnecting zones 17. In this example said zones 17 have the form of column-shaped recesses in the zone 6 which are entirely surrounded by the zone 6. The whole field effect transistor occupies an area of approximately 500×500 $\mu$m.

As is diagrammatically shown in FIG. 4, a voltage $V_{SD}$ is applied in the operating condition between the source electrode 7, 9 and the drain electrode 8, 10, while between the gate electrode 13, 4 and the source electrode 7, 9 a cutoff voltage $V_G$ is applied via the contact 5. By varying the blocking voltage $V_G$, the current from the source to the drain electrode, which is to pass the channel region 16, can be varied as a result of the thickness variation of the depletion regions which occur in the region 16 at the PN junctions with the gate electrode regions 4 and 13.

Since the gate electrode zones 13 contact the substrate region 4, 4A not only at the ends 14 and 15, but also between said ends via the connecting zone 17 at various places, the series resistance between the gate contact 5 and any point of the zone 13 is considerably reduced with respect to known structures, in which the zones 17 are absent.

The device described can be manufactured as follows: Starting material is a plate of P-type silicon, 25 mm. diameter, 250 $\mu$m. thickness, 0.1 ohm cm. resistivity, a surface of which is prepared by polishing and etching in the conventional manner. On this plate a large number of field effect transistors can be manufactured simultaneously, or also a number of monolithic planar integrated circuits which each comprise one or more of such field effect transistors, which transistors or circuits are afterwards separated in the conventional manner by sawing or breaking. The manufacture will be described here with reference to only one field effect transistor, the operations described being applied simultaneously to all the devices to be manufactured on the plate. FIGS. 5 and 6 illustrate the manufacture with reference to the cross section which in the ultimately obtained transistor corresponds to that shown in FIG. 3.

A layer 6 of N-type silicon, 8 $\mu$m. thickness, 1.5 ohm cm. resistivity, is grown on the polished and etched surface (see FIG. 5) by using commonly used epitaxial methods, for example, by thermal decomposition of $AsH_3$-doped $SiCl_4$. On this layer 6 an oxide layer 18 of a few 10ths of a $\mu$m., is provided by thermal oxidation in moist oxygen (see FIG. 5) in which apertures are etched, while using known photoresist methods, which apertures correspond to the regions 4A and 17 of the P-type to be formed (see FIGS. 1 to 4). In these apertures boron is diffused at 1200°, regions 4A and 17 (see FIG. 6) being formed with a depth of penetration of approximately 10 $\mu$m. and a sheet resistance of 4 ohm per square. The depth of penetration and surface concentration are not critical; essential is only that the diffusion of boron penetrates through the layer 16.

During these operations an oxide layer 19 (see FIG. 6) has formed on the surface of the diffused regions 4A and 17; should this layer be too thin for masking purposes, the oxide layer may be reinforced further by thermal oxidation.

Elongate windows are then etched in the oxide layer after which boron is diffused via said windows at 1100° for 45 minutes. The strip-shaped regions 13 are formed with depths of penetration of 3 $\mu$m. and a width of 3 $\mu$m., see FIGS. 1 to 4.

The contact windows (see FIG. 1) are then etched in the resulting oxide layer after which a phosphorus diffusion at 1100° for 15 minutes (sheet resistance 0.6 ohm per square) is carried out via said windows to form the contact regions 12 (see FIGS. 3 and 4). By a light etching operation the very thin oxide film formed during said diffusion in the contact windows is removed, after which the aluminum layers 7, 9 and 8, 10 belonging to the source and drain electrodes, are provided in the conventional manner by vapor-deposition, masking and etching. The other side of the plate is then ground down until the total thickness of the silicon plate is 120 $\mu$m., after the plate is soldered in the conventional manner with the ground-down side to a baseplate via an ohmic contact 5. As a result of this the structure of FIG. 3 is obtained. The layers 7, 9 and 8, 10 are further provided in the conventional manner with supply conductors and the device is finally accommodated in a suitable envelope.

It is to be noted that in the Figures the masked and diffused regions are only shown diagrammatically, the lateral diffusion below the oxide mask being not taken into account.

According to another method of manufacturing, the N-type zone 6 can be provided directly by diffusion in the substrate 4 by means of an oxide mask, as a result of which recesses 17 in the zone 6 are obtained. The remaining diffusions are carried out in the same manner as already described. The cross-sectional view taken on the line III–III of FIG. 1 is in this case shown in FIG. 7. The connection regions are in this case formed by parts 17 of the substrate from which was started so that no extra diffusion step is necessary for the formation of these regions.

FIGS. 8 to 12 show, in a plan view and a diagrammatic cross-sectional view taken on the lines IX–IX, X–X, XI–XI and XII–XII, another embodiment of the device according to the invention. This embodiment is quite similar to the preceding one with the difference that the connecting regions between the strip-shaped gate electrode zones 13 and the substrate region 4, 4A are not provided in the form of columns but in the form of continuous strip-shaped regions 30 (see FIGS. 7 to 11), the longitudinal direction of which is at substantially right angles to that of zones 13. These regions 30 divide the N-type zone 6 into five partial zones 6A to 6E (see FIGS. 7 and 9) in which the source and drain electrodes 7, 9 and 8, 10 contact all the partial zones 6A to 6E, via windows 11 in the oxide layer, and highly doped zones 12.

For the rest this construction is similar to the preceding one both in structure and dimensions and also as regards the operation and method of manufacturing. Instead of the oxide mask of FIG. 6, a considerably simpler mask can be used for the manufacture of this structure, which mask comprises a number of continuous gaps instead of separate windows to form the connecting zones 17.

It will be obvious that the invention is not restricted to the examples described, but that many variations are possible to those skilled in the art without departing from the scope of this invention. For example, the connecting zones may show forms differing from those in the examples described. Furthermore the device can be manufactured, besides in the manner described, also by other combinations of diffusion steps and/or epitaxial growing processes conventionally used in semiconductor technology. The conductivity types stated in the example may be interchanged, while reversing the polarity of the gate electrode voltage $V_G$. Furthermore, the connection to the substrate region can be effected by a contact on the surface 2 instead of by the contact 5.

I claim:

1. A semiconductor device having a semiconductor body, and an insulating layer covering at least partly one surface of the body, said body comprising at least one field effect transistor having a substrate region of one conductivity type including a portion extending to said one surface to form a gate electrode and means for electrical connection thereto, a first surface zone of the opposite conductivity type within said substrate region and at least two substantially parallel and spaced strip-shaped conductors ohmically connected to said first surface zone on said one surface to form source and drain connections respectively, a second surface zone of strip shape and of said one conductivity type between and substantially parallel to said conductors with the ends of said second surface zone extending beyond the first surface zone and joining the substrate region to form part of the gate electrode, a part of the first surface zone being located between the second surface zone and the substrate region and forming a channel region of the field effect transistor, and at least one interconnecting zone of said one conductivity type electrically connecting the second surface zone between its ends to the substrate region.

2. A semiconductor device as claimed in claim 1 wherein the interconnecting zone is fully surrounded by the first surface zone.

3. A semiconductor device as claimed in claim 1 wherein the interconnecting zone comprises a strip-shaped region adjoining the said one surface, the longitudinal dimension of said interconnecting zone extends at substantially right angles to that of the second surface zone, and said strip-shaped interconnecting zone divides the first surface zone of the opposite conductivity type into partial zones, the source and drain electrodes contacting all the partial zones.

4. A semiconductor device as claimed in claim 1 wherein the source and drain electrodes form an interdigital system.

5. A semiconductor device as claimed in claim 1 wherein the first surface zone of the opposite conductivity type is a diffused zone in a substrate of said one conductivity type and the said interconnecting zone is formed by a portion of the said substrate.

6. A semiconductor device as claimed in claim 1 wherein the source and drain connections comprise a highly doped surface region of the opposite conductivity type at least at the contact places with the first surface zone.

7. A semiconductor device as claimed in claim 1 wherein plural interconnecting zones are provided.

UNITED STATES PATENT OFFICE
CERTIFICATE OF CORRECTION

Patent No. 3586931 Dated June 22, 1971

Inventor(s) RIJKENT JAN NIENHUIS

It is certified that error appears in the above-identified patent and that said Letters Patent are hereby corrected as shown below:

In the Heading should have been inserted --

[32] Priority October 14, 1968

[33] Netherlands

[31] 6814763 --.

Signed and sealed this 30th day of November 1971.

(SEAL)
Attest:

EDWARD M.FLETHCER,JR.
Attesting Officer

ROBERT GOTTSCHALK
Acting Commissioner of Patents